(12) United States Patent (10) Patent No.: US 9,184,568 B2
Gotoda et al. (45) Date of Patent: Nov. 10, 2015

(54) WAVELENGTH VARIABLE LIGHT SOURCE AND WAVELENGTH VARIABLE LIGHT SOURCE MODULE

(71) Applicant: Mitsubishi Electric Corporation, Chiyoda-ku (JP)

(72) Inventors: Mitsunobu Gotoda, Tokyo (JP); Masakazu Takabayashi, Tokyo (JP); Eitaro Ishimura, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/461,698

(22) Filed: Aug. 18, 2014

(65) Prior Publication Data

US 2015/0063740 A1    Mar. 5, 2015

(30) Foreign Application Priority Data

Aug. 30, 2013 (JP) ................................ 2013-179590
Jun. 20, 2014 (JP) ................................ 2014-126826

(51) Int. Cl.
*G02F 1/035* (2006.01)
*H01S 5/40* (2006.01)
*H01S 5/022* (2006.01)
*H01S 5/026* (2006.01)
*H01S 5/10* (2006.01)
*H01S 5/12* (2006.01)

(52) U.S. Cl.
CPC ............ *H01S 5/4031* (2013.01); *H01S 5/0265* (2013.01); *H01S 5/4012* (2013.01); *H01S 5/026* (2013.01); *H01S 5/02284* (2013.01); *H01S 5/101* (2013.01); *H01S 5/1014* (2013.01); *H01S 5/12* (2013.01)

(58) Field of Classification Search
CPC ................ G02B 6/2808; G02B 6/2813; G02F 2001/212; G02F 1/225; G02F 2001/217; G02F 2203/70; H01S 5/4025
USPC ................ 385/1–4, 14, 15, 31, 46; 372/50.1, 372/50.12
See application file for complete search history.

(56) References Cited

U.S. PATENT DOCUMENTS

2012/0027041 A1* 2/2012 Yamazaki .................. 372/50.12
2013/0208350 A1* 8/2013 Saito et al. ................. 359/341.1

FOREIGN PATENT DOCUMENTS

| JP | 2005-317695 | 11/2005 |
|---|---|---|
| JP | 3887744 | 2/2007 |
| JP | 2011-44581 | 3/2011 |
| JP | 4728746 | 7/2011 |

* cited by examiner

*Primary Examiner* — Kaveh Kianni
*Assistant Examiner* — Hung Lam
(74) *Attorney, Agent, or Firm* — Oblon, McClelland, Maier & Neustadt, L.L.P.

(57) ABSTRACT

A wavelength variable light source according to the present invention includes: an MMI that includes an input side and an output side, the input side connecting to one end of each of a plurality of MMI input waveguides, and the output side connecting to a plurality of MMI output waveguides, the MMI multiplexing light input from each of the MMI input waveguides and outputting the multiplexed light to each of the MMI output waveguides; a plurality of DFB-LDs connected to the other end of each of the MMI input waveguides, each of the MMI output waveguides performing a single mode oscillation at a different wavelength; and two SOAs respectively connected to two MMI output waveguides of the MMI output waveguides, and having different gains from each other.

5 Claims, 6 Drawing Sheets

WAVELENGTH VARIABLE LIGHT SOURCE AND WAVELENGTH VARIABLE LIGHT SOURCE MODULE

BACKGROUND OF THE INVENTION

1. Field of the Invention

The present invention relates to a wavelength variable light source in which a plurality of semiconductor lasers is integrated, and a wavelength variable light source module including the wavelength variable light source.

2. Description of the Background Art

In recent years, a wavelength division multiplexing communication system that enables a large capacity transmission with one optical fiber by multiplexing a plurality of signal light beams having different wavelengths is being realized with significant increase in the demand for communication.

An LD (Laser Diode) of single mode (hereinafter referred to as single mode LD) in which high side mode suppression ratio (SMSR) of at least greater than or equal to 30 dB to 40 dB is obtained is suitable for a light source used in the wavelength division multiplexing communication system. The single mode LD includes, for example, a distributed feedback LD (hereinafter referred to as DFB-LD), a distributed Bragg reflector laser diode (hereinafter referred to as DBR-LD), and the like.

In order to realize the wavelength division multiplexing communication system, a low-cost wavelength variable light source that covers the entire wavelength band is necessary. An LD light source monolithically integrated on the same substrate has been given attention for the wavelength variable light source.

The wavelength variable light source is generally used in combination with an external modulator module that generates a data signal, but in addition, researches on monolithically integrating an electro-absorption (EA) light modulator and a Mach Zehnder (MZ) light modulator on the same substrate are also being carried out.

Conventionally, a wavelength variable light source configured so that an output side of a plurality of DFB-LDs is connected to an input waveguide of a multi-mode interference type optical multiplexing circuit (hereinafter referred to as MMI), and the light multiplexed by the MMI is output from an output waveguide is disclosed (see e.g., Japanese Patent No. 3887744). Hereinafter, the MMI of K input (K is a natural number) and L output (L is a natural number) is denoted as K×L-MMI. In other words, the K input refers to the K input waveguides connected to the MMI, and the L output refers to the L output waveguides connected to the MMI.

A wavelength variable light source in which an output side of a plurality of Ins is connected to N×2-MMI (N is a natural number of greater than or equal to three) and two output waveguides of the MMI are connected to two arms of the Mach Zehnder modulator is disclosed (see e.g., Japanese Patent No. 4728746). According to Japanese Patent No. 4728746, the light loss can be reduced compared to the case where the N×1-MMI is used.

A wavelength variable light source configured so that an output side of a plurality of DFB-LDs is connected to the MMI, and phase adjustment is performed at each of the two output waveguides of the MMI and then the light is output from one output waveguide through the other MMI is disclosed (see e.g., Japanese Patent Application Laid-Open No. 2011-44581). According to Japanese Patent Application Laid-Open No. 2011-44581, higher output can be realized and SN ratio (Signal to Noise ratio) can be improved.

In a wavelength division multiplexing communication system in which the transmission speed is greater than or equal to 40 Gbps in a mainline system, digital coherent communication using an optical phase modulation has been put into practical use in recent years. In the wavelength division multiplexing communication system adopting a digital coherent communication, a wavelength variable light source of a narrow line width having a laser oscillation line width of smaller than or equal to 1 MHz, and more desirably smaller than or equal to 500 kHz is used as the light source for transmission/reception.

In the wavelength division multiplexing communication adopting the digital coherent communication, a separate wavelength variable light source is required for transmission and for reception when the wavelengths of the light signals used for transmission and for reception are different from each other, which increases the power consumption of the entire transmission/reception device equipped with the wavelength variable light source.

In the wavelength division multiplexing communication adopting the digital coherent communication, the wavelengths of the light signals used for the transmission and for the reception are the same in some cases, and generally, the light output of the wavelength variable light source of a narrow line width that is required for the transmission and for the reception is different. In such a case, one wavelength variable light source is desirably provided to be used for the light source for transmission and for reception from the standpoint of reducing the power consumption and reducing the mounting area of the entire transmission/reception device.

For example, in a case in which the wavelength variable light source of each of Japanese Patent No. 3887744, Japanese Patent No. 4728746, and Japanese Patent Application Laid-Open No. 2011-44581 is used for the light source for transmission and for reception, the wavelength variable light source of each of Japanese Patent No. 3887744, Japanese Patent No. 4728746, and Japanese Patent Application Laid-Open No. 2011-44581, which is one-input, needs to be made to two-outputs with a polarization maintaining coupler. However, branching loss occurs in the polarization maintaining coupler in such a configuration, and thus an injecting current with respect to a semiconductor optical amplifier (hereinafter referred to as SOA) arranged on the output side of the wavelength variable light source needs to be increased to increase the light output from the wavelength variable light source in order to compensate for the branching loss. This may become the cause of increase in the power consumption and the laser oscillation line width.

SUMMARY OF THE INVENTION

It is an object of the present invention to provide a wavelength variable light source that can be used as a light source for transmission and for reception and that can suppress the increase in the laser oscillation line width and the power consumption, and a wavelength variable module.

A wavelength variable light source according to the present invention includes a first optical multiplexing circuit that includes an input side and an output side, the input side connecting to one end of each of a plurality of first input waveguides, and the output side connecting to a plurality of first output waveguides, the first optical multiplexing circuit multiplexing light input from each of the first input waveguides and outputting the multiplexed light to each of the first output waveguides; a plurality of semiconductor lasers connected to the other end of each of the first input waveguides, each of the plurality of semiconductor lasers performing a single mode oscillation at a different wavelength; and two optical amplifiers respectively connected to two first output waveguides of the first output waveguides and having different gains from each other; wherein each of the optical amplifiers has an output end side formed as a bent waveguide.

According to the present invention, a wavelength variable light source includes a first optical multiplexing circuit that includes an input side and an output side, the input side connecting to one end of a plurality of first input waveguides, and the output side connecting to a plurality of first output waveguides, the first optical multiplexing circuit multiplexing light input from each of the first input waveguides and outputting the multiplexed light to each of the first output waveguides; a plurality of semiconductor lasers connected to the other end of each of the first input waveguides, each of the plurality of semiconductor lasers performing a single mode oscillation at a different wavelength, and two optical amplifiers respectively connected to two first output waveguides of the first output waveguides and having different gains from each other, wherein each of the optical amplifiers has the output end side formed as the bent waveguide, so that the wavelength variable light source can be used as a light source for transmission and for reception and can suppress the increase in the laser oscillation line width and the power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be hereinafter described based on the drawings.

Hereinafter, the same or similar configuring portions in each figure are denoted the same reference number or the same name, and the functions thereof are also similar.

The dimension, material, and shape of each configuring element or the relative arrangement, or the like of the configuring element illustrated in each preferred embodiment may be appropriately changed according to the configuration and various conditions of the device, to which the present invention is applied, and the present invention is not to be limited to such illustrations.

<Underlying Technology>

First, the underlying technology of the present invention will be described.

Figure 11:
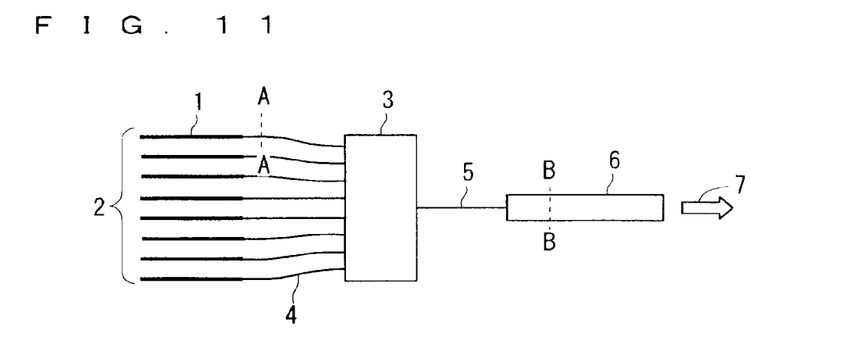
FIG. 11 is a view showing one example of a configuration of a wavelength variable light source according to an underlying technology.

FIG. 11 is a view showing one example of a configuration of a wavelength variable light source according to the underlying technology, and shows one example of a configuration of a wavelength variable light source that uses a plurality of single mode LDs having different oscillating wavelengths.

A DFB-LD array 2 is configured by N DFB-LDs 1, and is connected to an MMI input waveguides 4 of an N×1-MMI 3 (N is a natural number greater than or equal to three).

An SOA 6 is connected to an MMI output waveguide 5 of the N×1-MMI 3.

In the configuration described above, when an arbitrary DFB-LD 1 of the DFB-LD array 2 is laser oscillated, UN of the light (hereinafter referred to as LD output light) output from the DFB-LD 1 is coupled by the MMI output waveguide 5, and the remaining (N−1)/N is radiated to the outside of the MMI output waveguide 5. The branching loss, the coupling loss, and the like are compensated by injecting current to the SOA 6, where a high transmission light output 7 is output to the exterior from the SOA 6.

Figure 12:
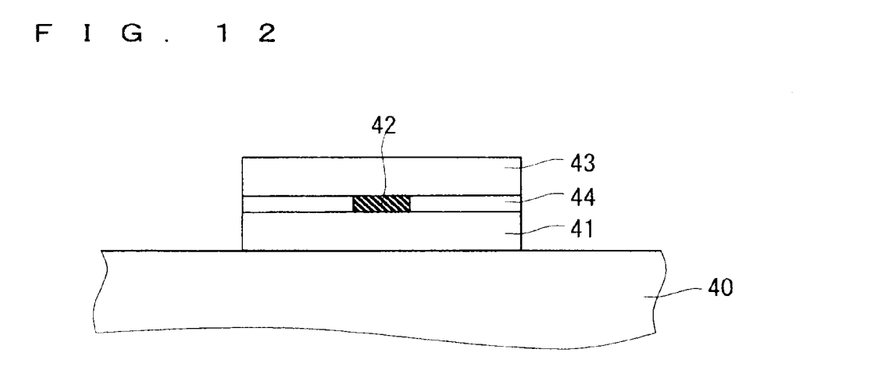
FIG. 12 is a cross-sectional view showing one example of a configuration of an MMI input waveguide in the wavelength variable light source according to the underlying technology.

FIG. 12 is a cross-sectional view showing one example of a cross-section taken along line A-A of FIG. 11, and shows one example of a configuration of the MMI input waveguide 4.

The MMI input waveguide 4 is formed by stacking in order, an InP lower clad layer 41, an InP current block layer 44 and an InGaAsP waveguide layer 42, and an InP upper clad layer 43 on an InP substrate 40. InGaAsP-based material that does not have absorption property with respect to the LD output light is used for the InGaAsP waveguide layer 42. The InGaAsP waveguide layer 42 may be a bulk epitaxial layer or a multiple quantum well (MQW) layer.

The configuration of the MMI input waveguide 4 is shown in FIG. 12, and the MMI output waveguide 5 has the same configuration as the MMI input waveguide 4

The configuration in a multi-mode region of wide width of the N×1-MMI 3 is similar to the configuration of the MMI input waveguide 4 and the MMI output waveguide 5 except that the width (width in the right and left direction in the plane of drawing of FIG. 12) of the InGaAsP waveguide layer 42 is wider than the MMI input waveguide 4 and the MMI output waveguide 5.

Figure 13:
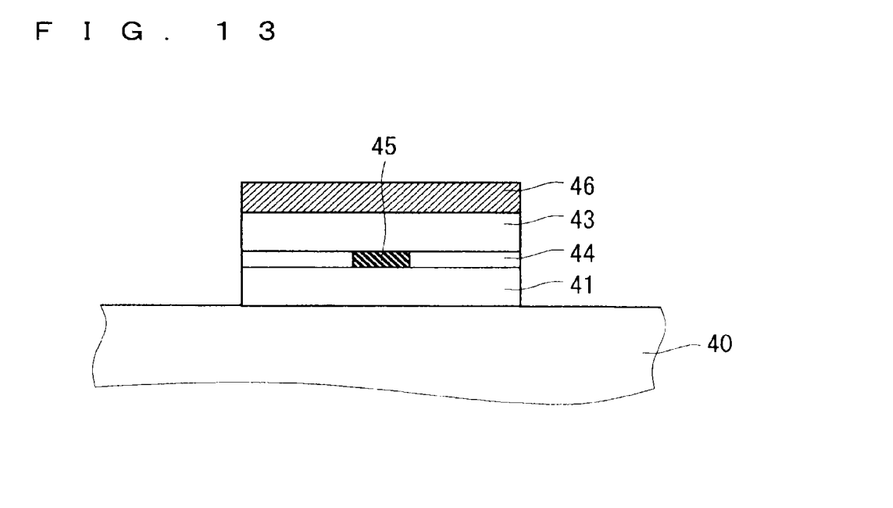
FIG. 13 is a cross-sectional view showing one example of a configuration of an SOA in the wavelength variable light source according to the underlying technology.

FIG. 13 is a cross-sectional view showing one example of a cross-section taken along line B-B of FIG. 11, and shows one example of a configuration of the SOA 6.

The SOA 6 is formed by stacking, in order, the InP lower clad layer 41, the InP current block layer 44 and an InGaAsP active layer 45, the InP upper clad layer 43, and an InGaAsP contact layer 46 on the InP substrate 40. An InGaAsP-based material that has a gain with respect to the light (hereinafter referred to as waveguide light) passing through the MMI output waveguide 5 is used for the InGaAsP active layer 45. The InGaAsP active layer 45 may be a bulk epitaxial layer or may be a multiple quantum well (MQW) layer.

The configuration of the SOA 6 is shown in FIG. 13, and the DFB-LD 1 has the same configuration as the SOA 6. In the DFB-LD 1 and the SOA 6, when current injection is carried out through an electrode (not shown) arranged on the InP substrate 40 and the InGaAsP contact layer 46, a gain is generated in the InGaAsP active layer 45 and spontaneous emission light is generated. In the DFB-LD 1, the spontaneous emission light with a specific wavelength reflected by a diffraction grating becomes the seed of induced emission, and laser oscillation occurs when the current exceeds a threshold value current defined in advance. The SOA 6 is designed to function as an amplifier with respect to the LD output line, and not to laser-oscillate alone.

The oscillating wavelength of the DFB-LD 1 changes at a rate of about 0.1 nm/° C. according to the temperature (hereinafter referred to as element temperature) of the DFB-LD 1. Therefore, the interval of the oscillating wavelength of each DFB-LD 1 is set so that the oscillating wavelength of an arbitrary DFB-LD 1 of the DFB-LD array 2 (e.g., N=10 to 16) coincides with the oscillating wavelength of another adjacent DFB-LD 1 when the element temperature is changed in a predetermined range (e.g., 10° C. to 50° C.). In this case, the entire wavelength band (about 30 nm to 40 nm) of the C band (Conventional band) or the L band (Long band) can be covered with the DFB-LD array 2 formed with one chip by simultaneously using the selection of the DFB-LD 1 and the element temperature adjustment.

Figure 14:
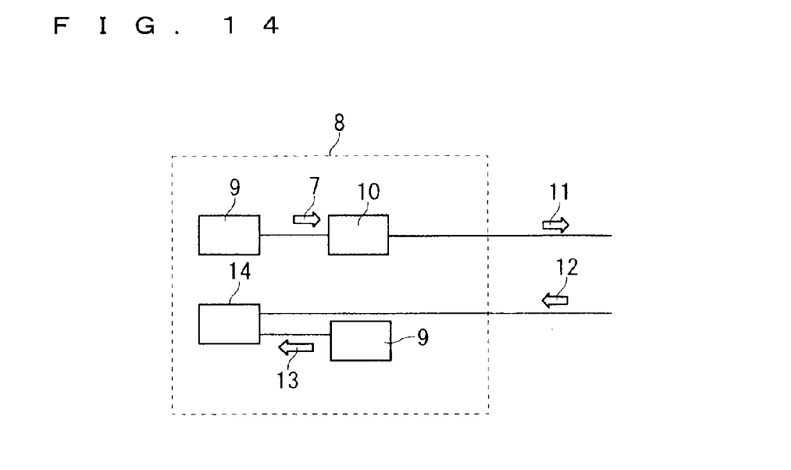
FIG. 14 is a view showing one example of a configuration of a transmission/reception device according to the underlying technology.

FIG. 14 is a view showing one example of a configuration of a transmission/reception device 8 according to the underlying technology, and shows a configuration of the transmission/reception device 8 for a digital coherent communication system.

The transmission light output 7 output from the wavelength variable light source module 9 is modulated by a modulator module 10, and output as a transmission signal 11 to the outside.

An externally received reception signal 12 is input to a reception module 14 with a reception light output 13 output from the wavelength variable light source module 9, subjected to signal processing, and then restored.

In the transmission/reception device 8 shown in FIG. 14, since the insertion loss occurs in the modulator module 10, the transmission light output 7 generally requires a high output, but the reception light output 13 may be a relatively low output.

As described above, however, if the wavelengths of the light signals used for the transmission and for the reception are the same, one wavelength variable light source module is desirably used as the light source for transmission and for reception from the standpoint of reducing the power consumption and reducing the mounting area of the entire transmission/reception device 8.

Figure 15:
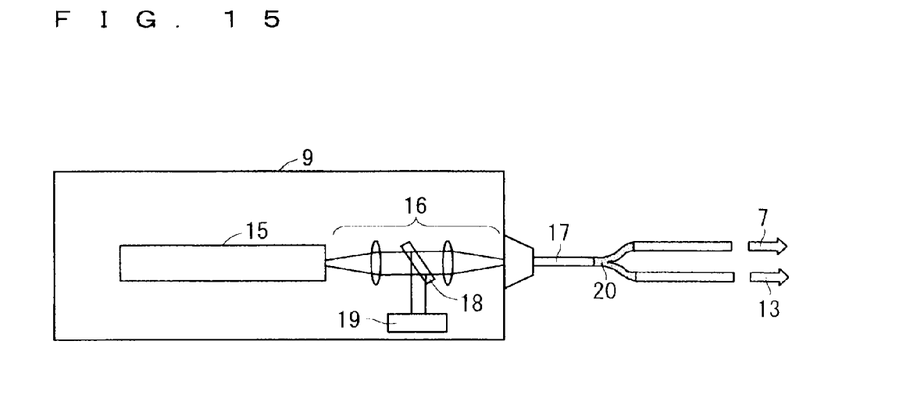
FIG. 15 is a view showing one example of a configuration of a wavelength variable light source module according to the underlying technology.

FIG. 15 is a view showing one example of a configuration of the wavelength variable light source module 9 according to the underlying technology, and shows a configuration in which the wavelengths of the light signals used for transmission and for reception are the same and one wavelength variable light source module is used as the light source for transmission and for reception.

The wavelength variable light source module 9 includes a wavelength variable light source 15, a coupling optical system 16, a beam splitter 18, and a monitor 19. An optical fiber 17 and a polarization maintaining coupler 20 are connected to the LD output side of the wavelength variable light source module 9.

The wavelength variable light source 15 exits the LD output light of a single mode, and the exit LD output light is coupled to the optical fiber 17 through the coupling optical system 16 including a lens, an optical isolator (not shown), and the like. The LD output light coupled to the optical fiber 17 is branched at a predetermined ratio by the polarization maintaining coupler 20, and each of the branched LD output light is output as the transmission light output 7 and the reception light output 13.

A part of the LD output light passing through the coupling optical system 16 is retrieved by the beam splitter 18, and the wavelength and the output level of the LD output light are detected by the monitor 19 including a wavelength filter, a photodiode, and the like (not shown).

The wavelength variable light source 15 is a one-output in the configuration described above, and thus is made to two-outputs by the polarization maintaining coupler. In such a configuration, however, the branching loss occurs in the polarization maintaining coupler, and hence the injecting current with respect to the SOA (not shown) arranged on the output side of the wavelength variable light source needs to be increased to increase the output of the LD output light from the wavelength variable light source 15 in order to compensate for the branching loss, which may become the cause of increase in the power consumption and the laser oscillation line width.

The present invention aims to solve such a problem, and will be described in detail below.

First Preferred Embodiment

Figure 1:
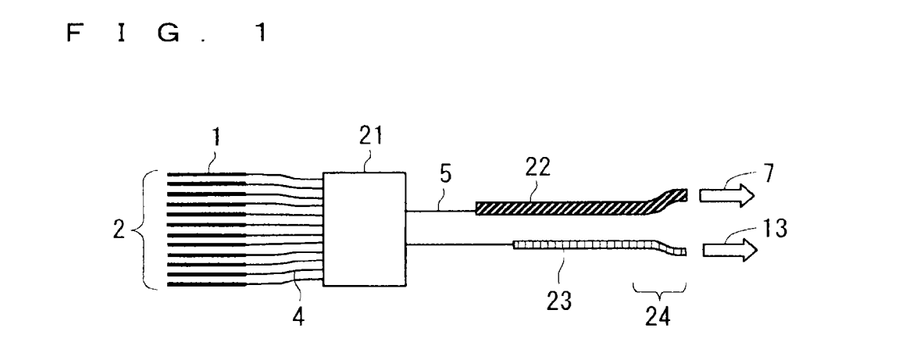
FIG. 1 is a view showing one example of a configuration of a wavelength variable light source according to a first preferred embodiment of the present invention.

FIG. 1 is a view showing one example of a configuration of a wavelength variable light source according to a first preferred embodiment of the present invention.

The wavelength variable light source according to the first preferred embodiment includes the DFB-LD array 2 configured by 12 DFB-LDs 1 (semiconductor laser), the MMI input waveguide 4 (first input waveguide), 12×2-MMI 21 (first optical multiplexing circuit), and a first SOA 22 and a second SOA 23 (optical amplifier), the output end sides of which being formed as a bent waveguide 24. The difference with the wavelength variable light source according to the underlying technology shown in FIG. 11 lies in that two MMI output waveguides 5 are connected to the 12×2-MMI 21 of the first preferred embodiment.

In the explanatory views of the underlying technology of FIG. 11 and the preferred embodiment, the output light is drawn in the horizontal direction for simplification but is, needless to say, actually exit in a direction determined by the bent angle of the exit waveguide. As will be described later, the respective output light can be independently coupled to two optical fibers with a small lens optical system.

The 12×2-MMI 21 includes the input side and the output side, one end of each of the 12 MMI input waveguides 4 is connected to the input side, two MMI output waveguides 5 are connected to the output side, the LD output light input from each MMI input waveguide 4 is multiplexed, and the multiplexed LD output light is output to each MMI output waveguide 5.

The 12 DFB-LDs 1 are connected to the other end of each of the MMI input waveguides 4, respectively, and each perform a single mode oscillation at a different wavelength.

The first SOA 22 and the second SOA 23 are respectively connected to the two MMI output waveguides 5 of the MMI output waveguides 5.

The SOA (first SOA 22 and second SOA 23) of the same waveguide type except the length (length in the passing direction of the LD output light) is provided at the exit end side of the two MMI output waveguides 5, and a current injection mechanism (not shown) is independently connected to each of the first SOA 22 and the second SOA 23. The first SOA 22 and the second SOA 23 are formed such that after removing a predetermined area of the MMI output waveguide 5 through etching, the cross-section of the MMI output waveguide 5 and the cross-sections of the first SOA 22 and the second SOA 23 are directly joined by the regrowing technique called a bat joint growing. Further, the output end face is subjected to a non-reflective coating (not shown) to suppress the generation of the reflection return light at the output end, and the bent waveguide 24 is formed on the output end sides of the first SOA 22 and the second SOA 23 to reduce the reflection return light from the output end face and to suppress the increase in the laser oscillation line width. The increase in the laser oscillation line width can be suppressed by suppressing the generation of the reflection return light.

The configurations of the MMI input waveguide 4, the MMI output waveguide 5, the DFB-LD 1, the first SOA 22, and the second SOA 23 are similar to the configurations shown in FIG. 12 and FIG. 13, and thus the description thereof will be omitted.

The operation of the wavelength variable light source will now be described.

When an arbitrary DFB-L 1 is selected and the current injection of greater than or equal to the threshold value current is carried out, the laser oscillation occurs in the selected DFB-LD 1. The LD output light output from the DFB-LD 1 is input to the multi-mode region of the 12×2-MMI 21 through the MMI input waveguide 4. As will be described later (see third, fifth, and sixth preferred embodiments), if the 12×2-MMI 21 is appropriately designed, the two MMI output waveguides 5 can be made to substantially equally couple the LD output light at a proportion of about ½, which is substantially the same extent as the DFB-LD 1 (see FIG. 11) according to the underlying technology, over the entire wavelength band. Therefore, even if two MMI output waveguides 5 are arranged, the drive current does not need to be increased than the DFB-LD 1 according to the underlying technology (i.e., the drive current of the DFB-LD 1 merely needs to be the same extent as the underlying technology).

When the current injection is carried out with respect to the first SOA 22 and the second SOA 23, the LD output light advancing through each MMI output waveguide 5 is amplified, and when the current value is increased, the gain in the first SOA 22 and the second SOA 23 increases. The gain is expressed by logarithmically displaying the output light intensity having the input light as a reference, but generally shows a nonlinear behavior. In other words, the gain is substantially constant if the input light is weak (low output), but the gain lowers if the input light is strong (high output), and hence a tendency in which the maximum output saturates with the input light intensity is shown. The saturation output per unit length of the first SOA 22 and the second SOA 23 is determined by the optical confinement coefficient and the current density of the active layer (corresponding to InGaAsP active layer 45 in FIG. 13) of the first SOA 22 and the second SOA 23. Therefore, if the optical confinement coefficient and the current density of the active layers of the first SOA 22 and the second SOA 23 are the same, the maximum output of the first SOA 22 and the second SOA 23 is determined by the lengths of the first SOA 22 and the second SOA 23.

As shown in FIG. 1, the length of the first SOA 22 is longer than the length of the second SOA 23, and the width and the optical confinement coefficient of the active layer are the same. Therefore, the maximum output at the same current density becomes higher in the first SOA 22 than in the second SOA 23. In other words, the gain is higher in the first SOA 22 than in the second SOA 23.

As described above, in the transmission/reception device for the digital coherent communication system, the reception light output 13 may be lower than the transmission light output 7, and thus the light amplified by the first SOA 22 can be used as the transmission light output 7, and the light amplified by the second SOA 23 can be used as the reception light output 13.

In other words, if the length of the first SOA 22 is the same as the SOA 6 (see FIG. 11) in the underlying technology, the drive current of the DFB-LD 1 necessary to obtain the same transmission light output 7 and the injected current with respect to the first SOA 22 are the same, and the injected current with respect to the second SOA 23 necessary to obtain the reception light output 13 is less than in the underlying technology. Therefore, if one wavelength variable light source according to the first preferred embodiment shown in FIG. 1 is used for the transmission/reception device, the power consumption can be reduced to smaller than or equal to ½ compared to the transmission/reception device (see FIG. 14) according to the underlying technology that uses a separate wavelength variable light source.

Therefore, according to the first preferred embodiment, the wavelength variable light source can be used as the light source for transmission and for reception, and the increase in the laser oscillation line width and the power consumption can be suppressed.

Second Preferred Embodiment

Figure 2:
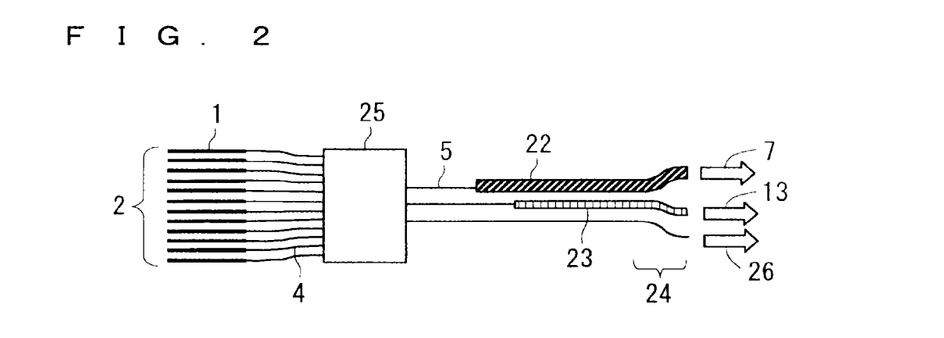
FIG. 2 is a view showing one example of a configuration of a wavelength variable light source according to a second preferred embodiment of the present invention.

FIG. 2 is a view showing one example of a configuration of a wavelength variable light source according to a second preferred embodiment of the present invention.

As shown in FIG. 2, the wavelength variable light source according to the second preferred embodiment includes a 12×3-MMI 25. In other words, three MMI output waveguides 5 are arranged. Other configurations and operations are similar to the first preferred embodiment, and thus the description thereof will be omitted herein.

Two of the three MMI output waveguides 5 are formed with the first SOA 22 and the second SOA 23, similar to the first preferred embodiment. Furthermore, the one remaining MMI output waveguide 5 is not formed with the SOA, and is used as a monitor light output 26.

The operation of the wavelength variable light source will now be described.

When an arbitrary DFB-LD 1 is selected and the current injection of greater than or equal to the threshold value current is carried out, the laser oscillation occurs in the selected DFB-LD 1. The LD output light output from the DFB-LD 1 is input to the multi-mode region of the 12×3-MMI 25 through the MMI input waveguide 4. As will be described later (see fourth preferred embodiment), if the 12×3-MMI 25 is appropriately designed, the two MMI output waveguides 5 can be made to substantially equally couple the LD output light at a proportion of about 1/12, which is substantially the same extent as the DFB-LD 1 (see FIG. 11) according to the underlying technology, over the entire wavelength band, and hence the drive current does not need to be increased than the DFB-LD 1 according to the underlying technology (i.e., the drive current of the DFB-LD 1 may be the same extent as the underlying technology).

When the current injection is carried out with respect to the first SOA 22 and the second SOA 23, the LD output light advancing through each MMI output waveguide 5 is amplified, where the light amplified by the first SOA 22 is used as the transmission light output 7 and the light amplified by the second SOA 23 is used as the reception light output 13.

The monitor light output 26 is received by an appropriate combination of a photodiode and an etalon so as to be used for the monitoring of the light output or the oscillating wavelength.

Therefore, according to the second preferred embodiment, the oscillating wavelength of the LD output light and the light output can be monitored in addition to the effects of the first preferred embodiment.

Third Preferred Embodiment

Figure 3:
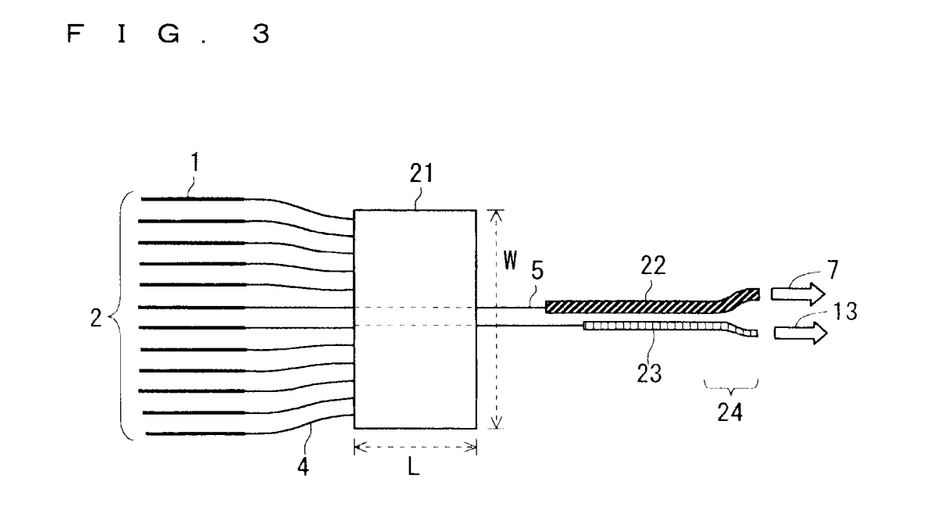
FIG. 3 is a view showing one example of a configuration of a wavelength variable light source according to a third preferred embodiment of the present invention.

FIG. 3 is a view showing one example of a configuration of a wavelength variable light source according to a third preferred embodiment of the present invention.

In the third preferred embodiment, appropriately designing the N×2-MMI (N is a natural number greater than or equal to three), that is, appropriately arranging the MMI input waveguide 4 and the MMI output waveguide 5 with respect to the N×2-MMI will be described.

The configurations and the operations of the wavelength variable light source according to the third preferred embodiment are similar to the first preferred embodiment (see FIG. 1), and thus the description thereof will be omitted herein.

As shown in FIG. 3, in the multi-mode region of the N×2-MMI 21 (N=12), the lateral width (the width of the input end face on the input side and the width of the output end face on the output side of the N×2-MMI 21) is assumed as W, and the length (length of the plane orthogonal to the input end face and the output end face) is assumed as L.

The arrangement positions of the 12 MMI input waveguides 4 are arranged to be symmetric with respect to the middle in the lateral width of the multi-mode region of the 12×2-MMI 21 as the origin (coordinate O) (with respect to W/2 of the input end face as the center) and at an interval of W/N. The two MMI input waveguides 4 on the outer sides are arranged at positions of W/(2N) from the end of the multi-mode region of the 12×2-MMI 21, that is, the coordinate (W/2−W/24, −W/2+W/24).

The two MMI output waveguides 5 are also arranged to be symmetric with respect to W/2 of the output end face as the center and at an interval of W/N, and are arranged at symmetric positions to the same center as the two MMI input waveguides 4 arranged at the middle of the 12 MMI input waveguides 4 in the example of FIG. 3, that is, the coordinate (±W/24).

The length L of the multi-mode region of the 12×2-MMI 21 may be substantially the same as the optimum value of the length L of the N×1-MMI 3 in the case that the arrangement of the MMI input waveguide 4 is similar to the above.

Therefore, according to the third preferred embodiment, effects similar to the first preferred embodiment are obtained by appropriately arranging the MMI input waveguides 4 and the MMI output waveguides 5 with respect to the N×2-MMI.

Fourth Preferred Embodiment

Figure 4:
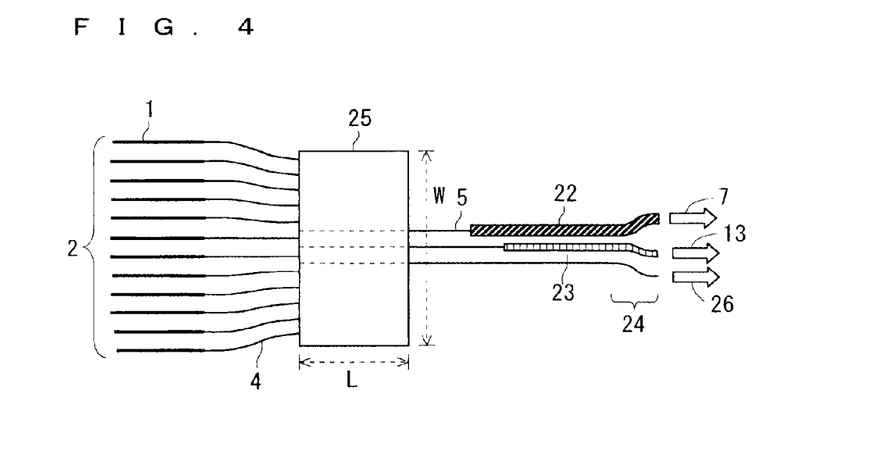
FIG. 4 is a view showing one example of a configuration of a wavelength variable light source according to a fourth preferred embodiment of the present invention.

FIG. 4 is a view showing one example of a configuration of a wavelength variable light source according to a fourth preferred embodiment of the present invention.

In the fourth preferred embodiment, appropriately designing the N×3-MMI (N is a natural number greater than or equal to three), that is, appropriately arranging the MMI input waveguide 4 and the MMI output waveguide 5 with respect to the N×3-MMI will be described.

The configurations and the operations of the wavelength variable light source according to the fourth preferred embodiment are similar to the second preferred embodiment (see FIG. 2), and thus the description thereof will be omitted herein.

As shown in FIG. 4, in the multi-mode region of the N×3-MMI 25 (N=12), the lateral width (the width of the input end face on the input side and the width of the output end face on the output side of the N×2-MMI 25) is assumed as W, and the length (length of the plane orthogonal to the input end face and the output end face) is assumed as L.

The arrangement positions of the 12 MMI input waveguides 4 are arranged to be symmetric with respect to the middle in the lateral width of the multi-mode region of the 12×3-MMI 25 as the origin (coordinate O) (with respect to W/2 of the input end face as the center) and at an interval of W/N. The two MMI input waveguides 4 on the outer sides are arranged at positions of W/(2N) from the end of the multi-mode region of 12×3-MMI 25, that is, the coordinate (W/2−W/24, −W/2+W/24).

The two MMI output waveguides 5 are also arranged to be symmetric with respect to W/2 of the output end face as the center and at an interval of W/N, and are arranged at symmetric positions to the same center as the three MMI input waveguides 4 arranged at the middle of the 12 MMI input waveguides 4 in the example of FIG. 4, that is, at the coordinates (0, ±W/24).

The length L of the multi-mode region of the 12×3-MMI 25 may be substantially the same as the optimum value of the length L of the N×1-MMI 3 in the case that the arrangement of the MMI input waveguide 4 is similar to the above.

Therefore, according to the fourth preferred embodiment, effects similar to the second preferred embodiment are obtained by appropriately arranging the MMI input waveguides 4 and the MMI output waveguides 5 with respect to the N×3-MMI.

Fifth Preferred Embodiment

In the wavelength variable light source of the third preferred embodiment, the two MMI output waveguides 5 of the N×2-MMI 21 (N=12) are arranged at the coordinate (±W/24) of the center symmetric position at an interval of W/N with the middle in the lateral width of the multi-mode region (lateral width W, length L) as the origin (coordinate O).

The MMI input waveguide 4 and the MMI output waveguide 5 can couple the LD output light at the proportion of substantially the same extent as the wavelength variable light source according to the underlying technology, but in a narrow sense, variation due to the input waveguide position and the wavelength exists. The coupling amount variation from the MMI input waveguide 4 to one MMI output waveguide 5 is defined as the coupling loss dispersion, and the coupling amount variation between the two MMI output waveguides 5 is defined as an output difference dispersion. The coupling loss dispersion and the output difference dispersion are both desirably minimized.

Figure 5:
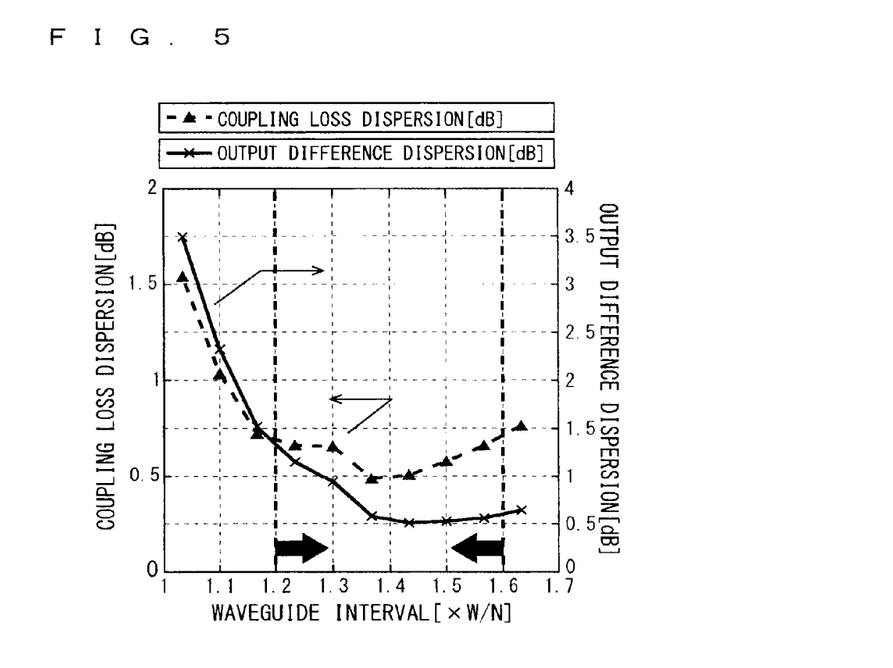
FIG. 5 is a view showing an output waveguide interval dependency of an MMI branching property in a wavelength variable light source according to a fifth preferred embodiment of the present invention.

The coupling loss variance and the output difference dispersion can be reduced by optimizing the interval of the output waveguides 5, compared to the third preferred embodiment. FIG. 5 is a view showing the output waveguide interval dependency of the coupling loss dispersion and the output difference dispersion in the 12×2-MMI. The waveguide interval on the horizontal axis is standardized with respect to the standard waveguide interval (W/N).

As shown in FIG. 5, it is apparent that the coupling loss dispersion and the output difference dispersion are optimized (minimized) when the interval of the MMI output waveguides 5 is 0.9 times the W/N. Furthermore, the deviation from the optimum value of the output difference dispersion can be suppressed to smaller than or equal to two dB within a range of great than or equal to 0.7 times and smaller than or equal to 1.1 times the interval of the MMI output waveguides 5.

Therefore, according to the fifth preferred embodiment, the MMI output waveguides 5 are arranged to be symmetric with respect to the W/2 of the output end face as the center and at an interval of greater than or equal to 0.7 times and smaller than or equal to 1.1 times the W/N to obtain the effect of reducing the coupling loss dispersion and the output difference dispersion compared to the third preferred embodiment.

Sixth Preferred Embodiment

In the wavelength variable light source according to the fifth preferred embodiment, the width W0 of the MMI input waveguide 4 and the MMI output waveguide 5 is constant. The center interval d of each waveguide is W/N for the MMI input waveguide 4 side and greater than or equal to 0.7 times and smaller than or equal to 1.1 times the WIN for the MMI output waveguide 5 side.

Figure 6:
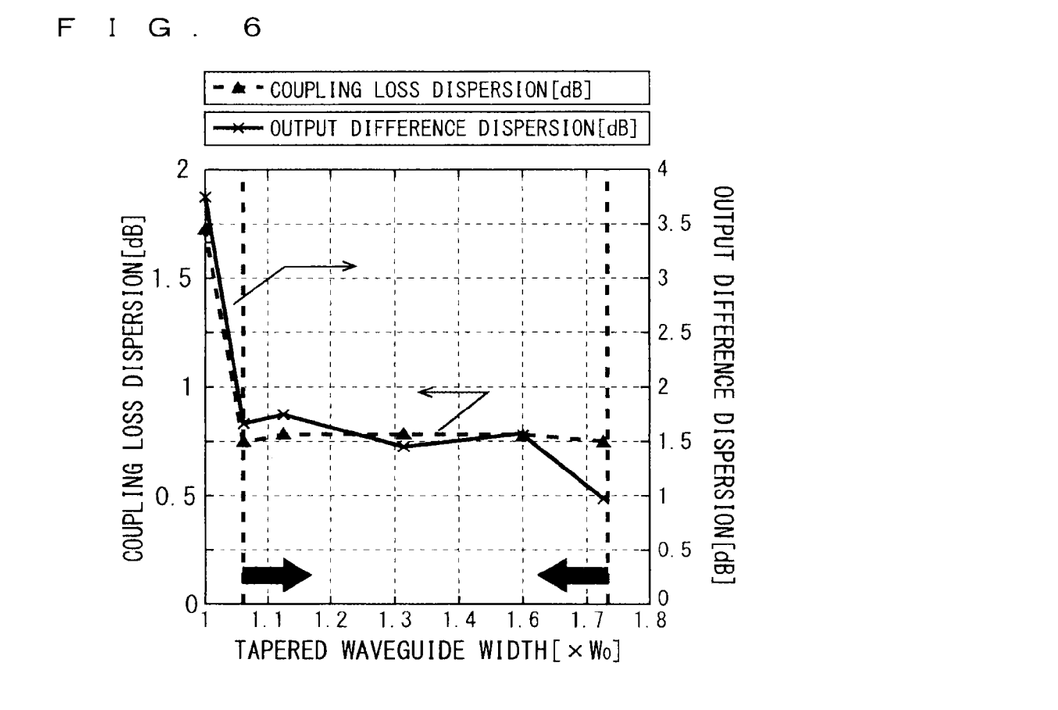
FIG. 6 is a view showing a maximum waveguide width dependency of the MMI branching property in a wavelength variable light source according to a sixth preferred embodiment of the present invention.

In the vicinity of the MMI multi-mode region (lateral width W, length L), the coupling loss dispersion and the output difference dispersion can be reduced, compared to the fifth preferred embodiment, by introducing the tapered waveguide (Wtaper, smaller than or equal to maximum d) that spreads the width of the MMI input waveguide 4 and the MMI output waveguide 5 from W0. FIG. 6 is a view showing the tapered waveguide width dependency of the coupling loss dispersion and the output difference dispersion in the 12×2-MMI. The tapered waveguide width on the horizontal width is standardized with respect to the standard waveguide width W0.

As shown in FIG. 6, the tapered waveguide width is spread to a tapered shape to greater than or equal to 1.05 times of the standard waveguide width W0 and smaller than or equal to the waveguide interval at a maximum (i.e., spread the respective width of the MMI input waveguide 4 and the MMI output waveguide 5 to a tapered shape to greater than or equal to 1.05 times the W/N and smaller than or equal to the arrangement interval of the MMI input waveguides 4 and the MMI output waveguides 5 toward the input end face and the output end face of the MMI multi-mode region (first optical multiplexing circuit), so that the coupling loss dispersion can be reduced by one dB and the output difference dispersion can be reduced by greater than or equal to two dB compared to the case that tapering is not performed.

Therefore, according to the sixth preferred embodiment, the respective widths of the MMI input waveguide 4 and the MMI output waveguide 5 are spread to a tapered shape to greater than or equal to 1.05 times of the standard waveguide width W0 and to smaller than or equal to the waveguide interval at a maximum, so that an effect of reducing the coupling loss dispersion and the output difference dispersion than the fifth preferred embodiment is obtained.

Seventh Preferred Embodiment

Figure 7:
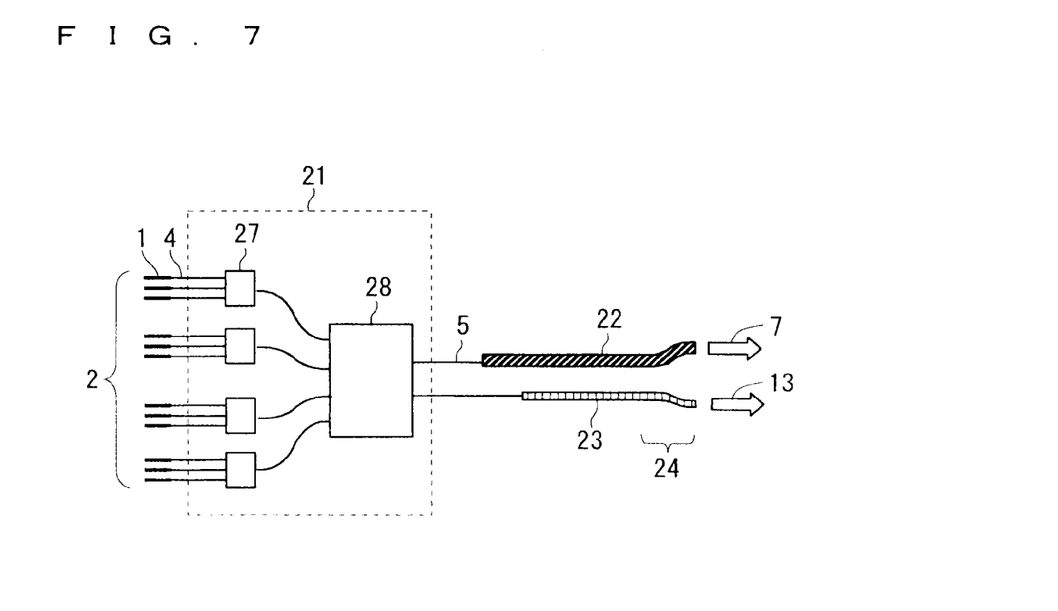
FIG. 7 is a view showing one example of a configuration of a wavelength variable light source according to a seventh preferred embodiment of the present invention.

FIG. 7 is a view showing one example of a configuration of a wavelength variable light source according to a seventh preferred embodiment of the present invention.

In the seventh preferred embodiment, the 12×2-MMI 21 is configured by a 3×1-MMI 27 (second optical multiplexing circuit) and a 4×2-MMI 28 (third light synthesizing circuit). Other configurations and operations are similar to the first preferred embodiment (see FIG. 1), and thus the description thereof will be omitted.

The 12×2-MMI 21 is configured by four 3×1-MMIs 27 and one 4×2-MMIs 28.

The 12 DFB-LDs 1 (not shown) are divided and arranged in four sets, three in one set, and each of the three DFB-LDs 1 are connected to the MMI input waveguide 4.

Each of the three MMI input waveguides 4 is connected to the input side of the 3×1-MMI 27. One output waveguide (second output waveguide) is connected to the output side.

The output waveguide of each 3×1-MMI 27 is connected to the input side of the 4×2-MMI 28 as the input waveguide (second input waveguide). The two MMI output waveguides 5 are connected to the output side of the 4×2-MMI 28.

Therefore, according to the seventh preferred embodiment, the effects similar to the second preferred embodiment are obtained even if the 12×2-MMI 21 is configured by the 3×1-MMI 27 and the 4×2-MMI 28. In other words, if n sets of DFB-LDs 1 (n is a natural number greater than or equal to two) exist, m (m is a natural number greater than or equal to two) DFB-LDs 1 forming a set, the effects similar to the first preferred embodiment can be obtained even if the 12×2-MMI 21 is configured by the n 3×1-MMI 27 in which each of the m MMI input waveguides 4 is connected to the input side and one output waveguide is connected to the output side, and the 4×2-MMI 28 in which a total of n output waveguides connected to each 3×1-MMI 27 are connected to the input side as the input waveguide and the MMI output waveguide 5 is connected to the output side.

In the seventh preferred embodiment, the case in which the configuration is similar to the first preferred embodiment has been described, but application can be made to any wavelength variable light source including the N×2-MMI.

Eighth Preferred Embodiment

Figure 8:
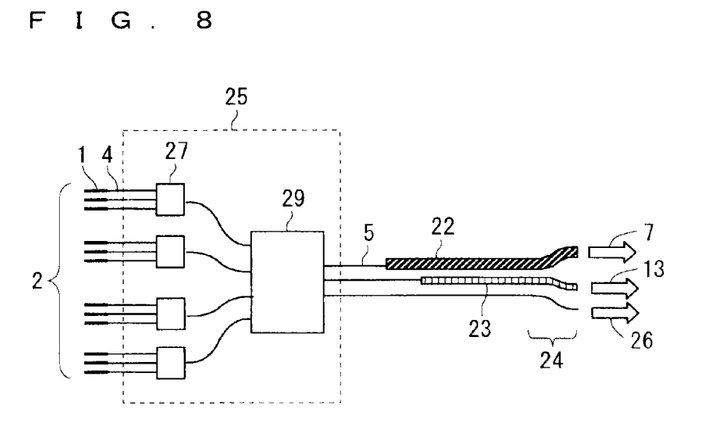
FIG. 8 is a view showing one example of a configuration of a wavelength variable light source according to an eighth preferred embodiment of the present invention.

FIG. 8 is a view showing one example of a configuration of a wavelength variable light source according to an eighth preferred embodiment of the present invention.

In the eighth preferred embodiment, the 12×3-MMI 25 is configured by the 3×1-MMI 27 and a 4×3-MMI 29. Other configurations and operations are similar to the second preferred embodiment (see FIG. 2), and thus the description thereof will be omitted.

The 12×3-MMI 25 is configured by four 3×1-MMIs 27 and one 4×3-MMI 29.

The 12 DFB-LDs 1 (not shown) are divided and arranged in four sets, three in one set, and each of the three DFB-LDs 1 is connected to the MMI input waveguide 4.

Each of the three MMI input waveguides 4 is connected to the input side of the 3×1-MMI 27. One output waveguide (second output waveguide) is connected to the output side.

The output waveguide of each 3×1-MMI 27 is connected to the input side of the 4×3-MMI 29 as the input waveguide. The three MMI output waveguides 5 are connected to the output side of the 4×3-MMI 29.

Therefore, according to the eighth preferred embodiment, the effects similar to the second preferred embodiment are obtained even if the 12×3-MMI 25 is configured by the 3×1-MMI 27 and the 4×3-MMI 29. In other words, if n sets of DFB-LDs 1 (n is a natural number greater than or equal to two) exist, m (m is a natural number greater than or equal to two) DFB-LDs 1 forming a set, the effects similar to the second preferred embodiment can be obtained even if the 12×3-MMI 25 is configured by the n 3×1-MMI 27 in which each of the m MMI input waveguides 4 is connected to the input side and one output waveguide is connected to the output side, and the 4×3-MMI 29 in which a total of n output waveguides connected to each 3×1-MMI 27 are connected to the input side as the input waveguide and the MMI output waveguide 5 is connected to the output side.

In the eighth preferred embodiment, the case in which the configuration is similar to the second preferred embodiment has been described, but application can be made to any wavelength variable light source including the N×3-MMI.

Ninth Preferred Embodiment

Figure 9:
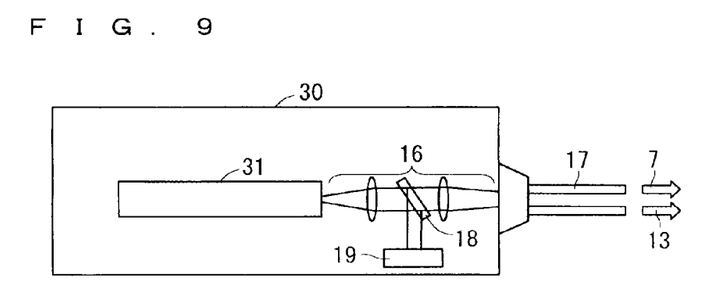
FIG. 9 is a view showing one example of a configuration of a wavelength variable light source module according to a ninth preferred embodiment of the present invention.

FIG. 9 is a view showing one example of a configuration of a wavelength variable light source module 30 according to a ninth preferred embodiment of the present invention.

In the ninth preferred embodiment, any one of the wavelength variable light sources according to the first to eighth preferred embodiments is used as a wavelength variable light source 31 of the wavelength variable light source module 30. Other configurations and operations in the wavelength variable light source module 30 are similar to the wavelength variable light source module 9 according to the underlying technology of FIG. 15, and thus the description thereof will be omitted.

As shown in FIG. 9, the two output ports of the wavelength variable light source module 30 are separated to two optical fibers 17 by the coupling optical system 16 and imaged, and the light output from each optical fiber 17 can be used as the transmission light output 7 and the reception light output 13. In other words, each of a plurality of output light beams output from the wavelength variable light source 31 is separately retrieved.

Therefore, according to the ninth preferred embodiment, the polarization maintaining coupler 20 arranged on the output side of the wavelength variable light source module 9 according to the underlying technology of FIG. 15 is not necessary, and hence the increase in the laser oscillation line width can be suppressed more than in the wavelength variable light source module 9 according to the underlying technology.

Tenth Preferred Embodiment

Figure 10:
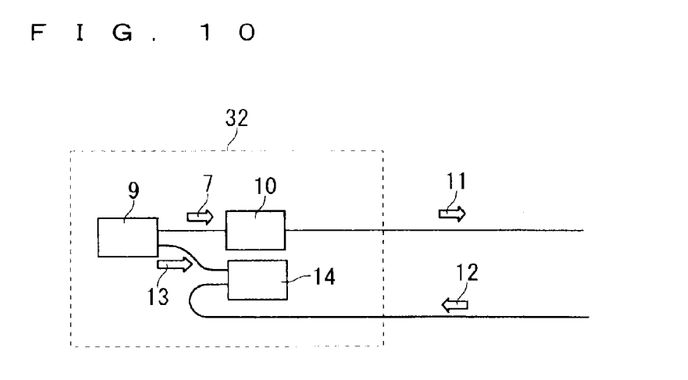
FIG. 10 is a view showing one example of a configuration of a transmission/reception device according to a tenth preferred embodiment of the present invention.

FIG. 10 is a view showing one example of a configuration of the transmission/reception device 32 according to a tenth preferred embodiment of the present invention.

In the tenth preferred embodiment, the transmission/reception device 32 includes the wavelength variable light source module 30 according to the eighth preferred embodiment.

The transmission light output 7 output from the wavelength variable light source module 30 is modulated by the modulator module 10, and then output as the transmission signal 11 to the outside.

The externally received reception signal 12 is input to the reception module 14 with the reception light output 13 output from the wavelength variable light source module 30, subjected to signal processing, and then restored.

Thus, the wavelength variable light source module 30 is used as the light source module for transmission and for reception.

Therefore, according to the tenth preferred embodiment, the wavelength variable light source module 30 can be used as the light source module for transmission and for reception, and thus the power consumption can be reduced further than the transmission/reception device 8 (see FIG. 14) using the two wavelength variable light source modules 9 according to the underlying technology.

In the present invention, each preferred embodiment may be freely combined, and each preferred embodiment may be appropriately modified or omitted within a scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A wavelength variable light source comprising:
a first optical multiplexing circuit that includes an input side and an output side, said input side connecting to one end of each of a plurality of first input waveguides, and said output side connecting to a plurality of first output waveguides, the first optical multiplexing circuit multiplexing light input from each of said first input waveguides and outputting said multiplexed light to each of said first output waveguides;
a plurality of semiconductor lasers connected to the other end of each of said first input waveguides, each of the plurality of semiconductor lasers performing a single mode oscillation at a different wavelength; and
two optical amplifiers respectively connected to two of said first output waveguides of said first output waveguides and having different gains from each other, wherein
each of said optical amplifiers has an output end side formed as a bent waveguide.

2. The wavelength variable light source according to claim 1, wherein
when a width of an input end face of said input side and a width of an output end face of said output side of said first optical multiplexing circuit are W, and N (N being a natural number greater than or equal to three) of said first input waveguides exist,
said first input waveguides are arranged symmetrically with respect to W/2 of said input end face as a center and at an interval of W/N; and
said first output waveguides are arranged symmetrically with respect to W/2 of said output end face as a center and at an interval of greater than or equal to 0.7 times and smaller than or equal to 1.1 times the W/N.

3. The wavelength variable light source according to claim 2, wherein the each widths of said first input waveguides and said first output waveguides is spread to a tapered shape of greater than or equal to 1.05 times the W/N and smaller than or equal to an arrangement interval of said first input waveguides and said first output waveguides toward said input end face and said output end face of said first optical multiplexing circuit.

4. The wavelength variable light source according to claim 1, wherein when n sets (n is a natural number greater than or equal to two) of said semiconductor lasers, m (m is a natural number greater than or equal to two) semiconductor lasers forming a set, exist, said first optical multiplexing circuit includes, n second optical multiplexing circuits in which each of said m first input waveguides is connected to an input side and one of second output waveguide is connected to an output side; and a third optical multiplexing circuit in which a total of n said second output waveguides connected to each of said second optical multiplexing circuits are connected to the input side as a second input waveguide, and said first output waveguides are connected to an output side.

5. A wavelength variable light source module comprising the wavelength variable light source according to claim 1, wherein each of a plurality of output light beams output from said wavelength variable light source is separately retrievable.

* * * * *